United States Patent [19]

Lind

[11] 4,137,496
[45] Jan. 30, 1979

[54] LINE FREQUENCY DEVIATION MONITOR

[76] Inventor: LeRoy R. Lind, 10038 Cedar Lake Rd., Minnetonka, Minn. 55343

[21] Appl. No.: 833,735

[22] Filed: Sep. 16, 1977

[51] Int. Cl.² ........................................... G01R 23/02
[52] U.S. Cl. ............................... 324/78 Z; 324/78 D
[58] Field of Search ..................... 324/181, 186, 78 D, 324/79 D, 78 Z, 83 D; 328/134

[56] References Cited

U.S. PATENT DOCUMENTS

| 2,987,674 | 6/1961 | Shain | 324/78 D |
| 3,304,504 | 2/1967 | Horlander | 324/78 D |
| 3,514,697 | 5/1970 | Oswald | 324/78 D |

Primary Examiner—M. Tokar
Attorney, Agent, or Firm—Schroeder, Siegfried, Ryan, Vidas & Steffey

[57] ABSTRACT

A monitor for indicating deviation of an alternating current power source from a nominal operating frequency. The monitor circuit provides an indication when the frequency being measured is at its nominal value and provides further indications when it differs from the nominal frequency by a predetermined amount either in an above-frequency or a below-frequency manner. Further means are provided to supply an alarm indication indicative of an out-of-tolerance deviation either in a high or low frequency.

7 Claims, 3 Drawing Figures

LINE FREQUENCY DEVIATION MONITOR

The present invention relates to an electronic circuit for monitoring frequency deviations of an alternating current signal about a nominal operating frequency.

The frequency of alternating current power sources is critical to the proper operation of many alternating current devices. In applications where the alternating current frequency is supplied by portable motor generator apparatus, it is necessary to provide the operator of the apparatus with a readily ascertainable indication of proper frequency operation of the apparatus.

Electronic frequency meters of the digital type have been employed for the measuring of the frequency of a particular signal, but such instruments have the shortcoming of extreme complexity, especially when designed for use in measuring a broad range of frequencies. Even frequency meters designed for measurement of a limited range of frequencies are fairly complex and require elaborate readout apparatus.

Accordingly, it is a main object of the present invention to provide an electronic monitor for measuring the deviation of a particular frequency from a nominal value.

Another object is to provide an electronic frequency deviation monitor which provides a visual indication when the deviation from the nominal frequency exceeds predetermined tolerance limits.

Other aims and advantages of the invention will be apparent from the following description and appended claims.

In the drawings.

Similar elements in the three figures have been identified with the same identification numbers.

Figure 1:
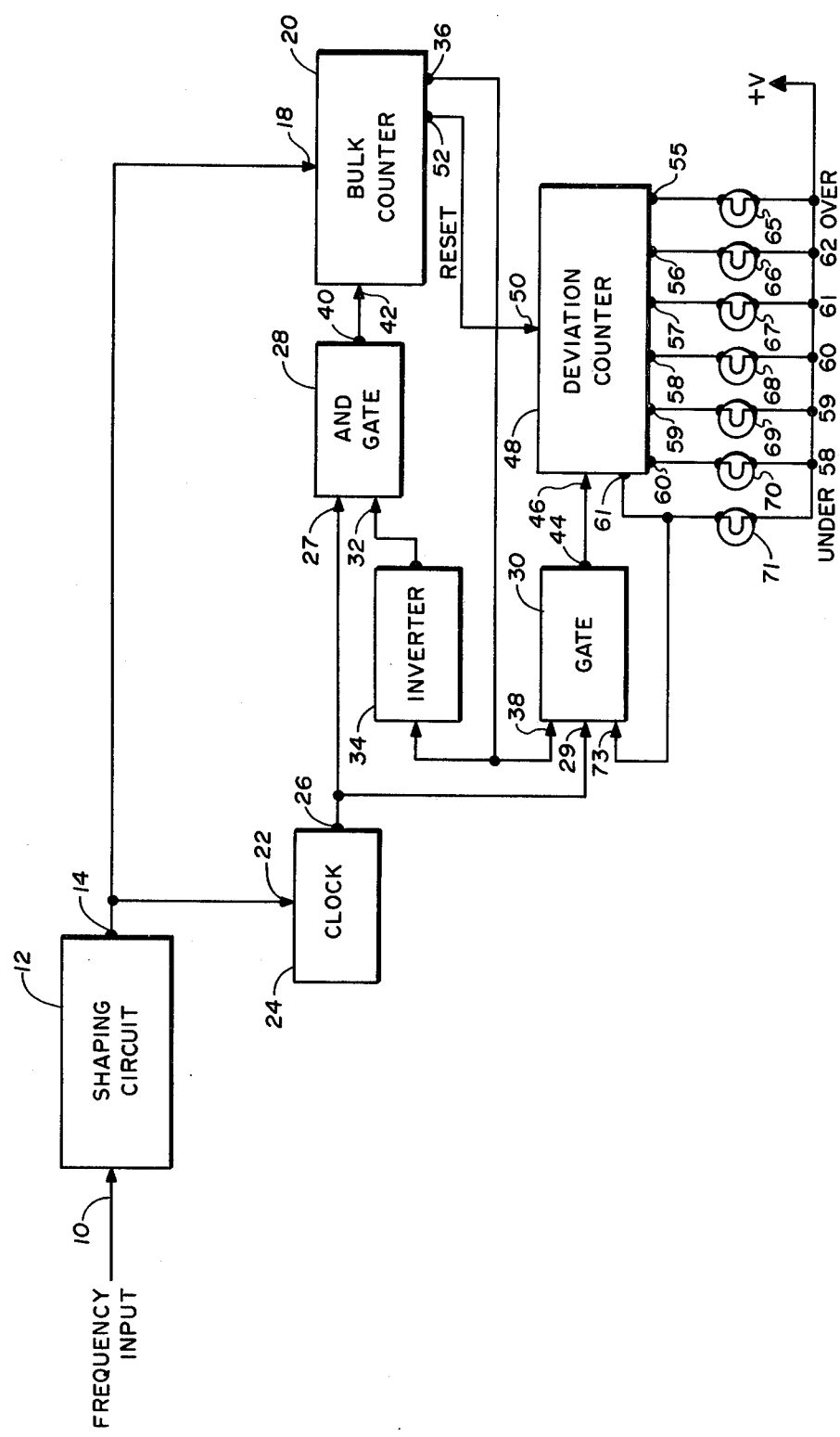
FIG. 1 is a simplified block diagram of a frequency meter according to the present invention.

Referring now to FIG. 1, the signal whose frequency is to be measured is applied to frequency input 10 of a shaping circuit 12 which has, as its output on terminal 14, a square wave having a period identical to the period of the input signal. The square wave from terminal 14 is applied to a reset terminal 18 of a bulk counter 20 and to an inhibit input 22 of a clock generator 24.

Figure 2:
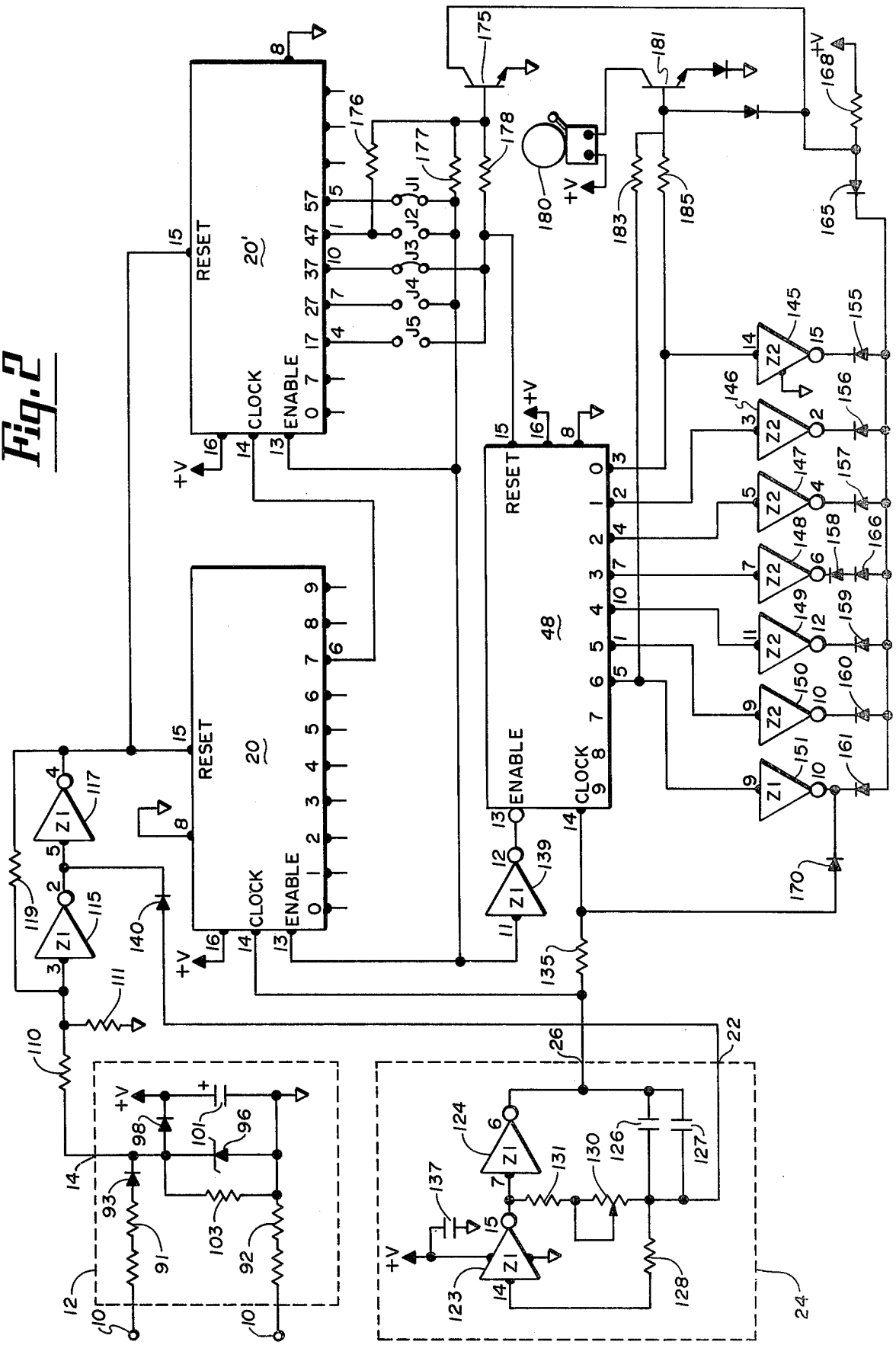
FIG. 2 is a schematic diagram of the preferred embodiment of the frequency meter.

When the frequency meter of FIG. 1 or FIG. 2 is used to monitor the 60-Hertz frequency of an AC power generator, the oscillator is set at 7200 Hz for normal operation in the preferred embodiment shown in FIG. 2.

Clock 24 produces output pulses at the 7200-Hz rate on terminal 26 when the signal at its inhibit input 22 is not a positive signal. Thus, clock 24 is activated to produce output pulses for one-half of the period of the input sine wave signal. The chain of pulses from the output 26 of clock 24 is applied to an input 27 of an AND gate 28 and an input 29 of a further gate 30. The other input 32 of AND gate 28 receives its input from an inverter 34 which receives its input from an output terminal 36 of bulk counter 20. Output 36 of bulk counter 20 is also connected to an input 38 of gate 30. The output 40 of AND gate 28 is connected to the clock input 42 of bulk counter 20.

The output 44 of gate 30 is connected to input 46 of deviation counter 48. Deviation counter 48 also receives an input 50 from output terminal 52 of bulk counter 20. Seven output terminals of deviation counter 48 identified as 55-61 respectively are connected to output indicator devices 65-71 respectively. Additionally, output 61 is connected to input 73 of gate 30.

The circuit of FIG. 1 operates by counting the number of clock pulses which occur during one-half cycle of the input frequency. The frequency of the clock is selected so that the number of clock pulses occurring during one-half cycle of the nominal input frequency will be equal to the nominal input frequency. Thus, for a nominal 60-cycle input frequency, the clock is operated at 7200 pulses per second to produce 60 clock pulses during one-half cycle of the input frequency.

In the circuit shown in FIG. 1, the input sinusoid is clipped by shaping circuit 12 so that it has a positive signal level during one-half of the period of the input signal and a "0" signal during the other half of the period. During the half of the period when the output 14 of shaping circuit 12 is a positive voltage, clock 24 is started and bulk counter 20 is reset. When the input signal crosses 0 and the output 14 of shaping circuit 12 switches from a "1" to a "0," clock oscillator 24 begins to produce pulses at 7200 pulses per second and the reset signal is removed from bulk counter 20. Since bulk counter 20 has been reset, the outputs at outputs 36 and 52 are initially 0. The 0 output from terminal 36 is inverted by inverter 34 to a "1" which is applied to input 32 of AND gate 28 in conjunction with pulses applied to terminal 27, and gate 28 functions to produce a chain of output pulses at terminal 40 which are connected to the clock input 42 of counter 20 which begins to count the pulses as they are received.

As the initial pulses are counted by bulk counter 20, the "0" on output terminal 36 inhibits gate 30 from transmitting pulses to deviation counter 48. After 55 pulses have been counted by bulk counter 20, the output at terminal 52 switches from a "0" to a "1" to reset deviation counter 48. When the next pulse is received by counter 20, terminal 52 switches back to a "0" and terminal 36 switches to a "1," enabling gate 30 to transmit pulses to the clock input 46 of deviation counter 48. In addition to enabling gate 30, the output signal from terminal 36 is inverted to a "0," thereby causing AND gate 28 to stop feeding pulses to bulk counter 20.

Terminal 52 of counter 20 is the terminal representing the 55th pulse, while terminal 36 is the terminal which changes state upon the receipt of the 56th pulse at input terminal 42 of bulk counter 20. The 57th pulse of clock 24 is then applied to clock input 46 of deviation counter 48. Each pulse received on input 46 of deviation counter 48, after it has been reset at input 50, advances the counter, i.e., it moves the "1" from terminal 52 to terminal 36, etc.

If the number of pulses gated from the clock during the half cycle of the input frequency is equal to 60, the output of terminal 58 will have a logic "1" when the measurement interval is completed and the input signal again crosses 0 and clock 24 is inhibited while bulk counter 20 is reset.

The logic "1" at terminal 58 activates indicator 68 which indicates that the input frequency is at the normal frequency of 60 Hz. If only 59 pulses are gated from clock 24 during a one-half cycle of the input frequency, the logic 1 in deviation counter 48 will only be advanced to output terminal 57, and indicator 67 will be lit.

The time duration for the gating of 59 pulses from clock 24 at 7200 pulses per second is 59 times the period of the 7200-pulse-per-second clock or 59 times 0.139 milliseconds or 8.189 milliseconds which translates to a frequency of 61 Hz. By similar reasoning, if indicator 66 is lit at the end of the sequence, the input frequency is 62 Hz, and if indicator 65 is lit, the input frequency exceeds 62 Hz. Similarly, indicators 69, 70, and 71 correspond to input frequencies 59, 58, and less than 58 Hz. In order to prevent the count in deviation counter 48 from advancing beyond the stage having its output at 61, output 61 is coupled to input terminal 73 of gate 30 to inhibit gate 30 from transmitting further pulses when output 61 is a logic "1."

FIG. 2 is a detailed schematic diagram of the preferred embodiment of the invention. The input AC signal is applied across terminals 10 through resistors 91 and 92 and diode 93 which rectifies the input sine wave. The half wave, rectified sine wave is also clipped by zener diode 96 which has a zener breakdown voltage of approximately 12 volts. The current through diode 96 is limited by the action of diode 98 and capacitor 101 and resistor 103. The rectified, clipped signal at the cathode of zener diode 96 is applied to a voltage divider comprised of resistors 110 and 111 which has its output connected to an input terminal 3 of an inverting buffer amplifier 115 which has its output terminal 2 connected to the input terminal 5 of a further buffer amplifier 117 which has its output terminal 4 connected through a positive feedback resistor 119, to input terminal 3 of buffer amplifier 115.

Amplifiers 115 and 117 as well as all other amplifiers labeled "$Z_1$" on FIG. 2 are part of a Fairchild Semiconductor, Inc. CMOS inverting buffer amplifier module No. 34049, and the pin numbers indicated in FIG. 2 are the pin designations of the manufacturer.

During the positive half cycle of the input signal applied to terminals 12, the output at terminal 2 of amplifier 115 is a negative voltage and the outupt at terminal 4 of amplifier 117 is a positive voltage. Use of positive feedback through resistor 119 assures a rapid switching action by amplifiers 115 and 117. The positive voltage appearing at terminal 4 of 117 is applied to reset terminals of a five-stage decade counters 20 and 20' which are manufactured by Fairchild Semiconductor as Fairchild CMOS 34017 devices. The pin designations shown for counters 20 and 20' are the pin designations of the manufacturer. Both counters are reset when they receive the positive voltage from the output of amplifier 117.

Clock 24 is comprised of two inverting buffer amplifiers 123 and 124 which are also sections of the buffer amplifier device $Z_1$. The output of amplifier 123 at pin 15 is connected to input terminal 7 of amplifier 124 which has its output terminal 6 connected through capacitors 126 and 127 to a resistor 128 which is in turn connected to input terminal 14 of amplifier 123. The junction of resistor 128 and capacitors 126 and 127 is also connected through an adjustable resistor 130 and a fixed resistor 131 to the junction between the output terminal 15 and input terminal 7 of amplifiers 123 and 124 respectively. Capacitor 133 is connected to the DC input terminal of device $Z_1$.

The combination of inverting buffer amplifiers 123 and 124 and their associated resistors and capacitors comprises an astable or free-running oscillator. The frequency of operation is adjusted by selection of capacitors 126 and 127 and adjustment of the resistance of resistor 131 and adjustable resistor 130. In the preferred embodiment of the invention, the pulse repetition rate is 7200 Hz.

Clock 24 is inhibited from operation during the positive half cycle of the input frequency by diode 140 which clamps the feedback network of clock 24 to the negative voltage appearing at terminal 2 of amplifier 115 during the positive half cycle of the input signal. When the negative half-cycle of the input signal is applied to terminals 10, the voltage at the output terminal 2 of amplifier 115 switches to a positive voltage, and the clamping action of diode 140 ceases, permitting the commencement of operation of clock 24. The pulses from clock 24 are applied to the clock input 14 of decade counter 20 and through a resistor 135 to clock input 14 of deviation counter 48 which is also a Fairchild Semiconductor CMOS device No. 34017.

The enable signals to pin 13 of counters 20 and 20' are applied through jumper $J_1$ which is connected to pin 5 of counter 20'. Pin 5 of counter 20' is connected to the sixth position of the counter and is initially at a low voltage representative of a logic "0." When enable terminals 13 of counters 20 and 20' are at a low voltage and a positive pulse is applied to the clock terminal 14, the counter advances one step for each pulse. The eighth stage of counter 20 at pin 6 is connected to clock input 14 of counter 20'. Thus, counter 20' will receive a clock pulse at its input on the 7th, 17th, 27th, etc., pulse applied to clock input 14 of counter 20. When the seventh stage of counter 20' at pin 05 switches from a "0" to a "1," it is an indication that 57 pulses have been applied to the input of counter 20, and the positive level at that stage of the counter is applied to enable terminals 13 of both counters 20 and 20' to condition the counters not to respond to further clock pulses applied to their input terminals. The positive signal at pin 5 of counter 20' is also applied to a further buffer amplifier 139 which is a further buffer amplifier on the $Z_1$ buffer amplifier module which also includes amplifiers 115, 117, 123, and 124. The positive signal from pin 5 of counter 20' is inverted and applied to pin 13 of counter 48 to enable that counter to begin to respond to the clock pulses applied to pin 14. Thus, counter 48 begins to count when it receives the 58th and subsequent pulses from clock 24. Counter 48 was reset to 0, in the preferred embodiment shown, when the count in counter 20' reached the fifth position representative of 37 pulses and a reset positive level signal was applied through jumper $J_3$ to reset terminal 15 of counter 48.

In the preferred embodiment shown in FIG. 2, each of the first seven stages of counter 48 is connected to an input terminal of an inverting buffer amplifier located on device $Z_1$ or an identical device $Z_2$. The amplifiers are identified in FIG. 2 as 145–151 respectively and have their outputs connected to the anodes of light emitting diodes 155–161 respectively. Diodes 155–157 and 159–161 have their anodes connected to the cathode of a diode 165. The anode of light emitting diode 158 is connected to the cathode of a light emitting diode 166 which has its anode connected to the cathode of diode 165 which has its anode connected through a resistor 168 to the positive power supply.

Prior to the enabling of counter 48, the second through seventh outputs are all "0s" which are inverted by their respective amplifiers to positive signals back biasing light emitting diodes 156–161 and 166. The positive level at the output of amplifier 151 also back biases diode 170 which has its anode connected to the clock input at terminal 14 at counter 48.

The junction between the anode of diode 165 and resistor 168 is connected to the collector of transistor 175 which has its emitter grounded and its base connected through resistor 176 to pin 1 of counter 20' and through resistor 177 to pin 5 of counter 20' through jumper J₁ and through resistor 178 to pin 10 to counter 20' through jumper J₃. Transistor 175 acts as an OR gate to clamp the voltage at the anode of diode 165 to ground during the interval after counter 48 is reset prior to receiving a new stream of pulses.

If the circuit of FIG. 2 is measuring a signal at input terminal 10 which has a frequency of 60 cycles per second, exactly 60 pulses of the 7200-Hz clock signal will be counted, and the count will end up in the fourth stage of counter 48 at pin 7 which is at a logic "1" voltage. Thus, the output of inverting buffer amplifier 148 will be at a logic "0" providing a path to ground for the anodes of light emitting diodes 158 and 166. No positive voltage is applied to the anodes of 158 and 166 until the completion of the negative half cycle of the input signal when the reset voltage is applied to counters 20 and 20', removing the logic 1 from pin 5 of counter 20', and all of the positive voltages applied to resistors 176, 177, and 178, allowing transistor 175 to turn off so that a positive voltage can be applied to the anodes of diodes 166 and 158 to turn them on, indicating that an input frequency of 60 Hz per second was present. The 60-Hz indication will remain on until the count on the next cycle of input reaches 37 to reset counter 48 and turn on transistor 175.

As with the case with the circuit shown in FIG. 1, for input frequencies for which less than 60 pulses are detected during the measurement interval, each pulse less than 60 advances counter 48 by one count less than the four counts indicative of the measurement of 60-Hz signal and correspond to frequencies of 61 Hz for indicator 157, 62 Hz for indicator 156, and over 63 Hz for indicator 155. Similarly if the input frequency is less than 59 Hz, an additional pulse will be received lighting indicator 159. If the input frequency is 58 Hz, indicator 160 will light, and if it is 57 Hz, diode 161 will light, indicating receipt of 63 pulses by the counting circuits. When the count reaches the seventh stage of counter 48 indicating a count of 63, diode 170 clamps the clock input to counter 48 to prevent the count from advancing further so that if indicator 161 is lit, it indicates a frequency of 57 Hz or less.

In addition to the visible indications of frequency provided by the light emitting diodes 155–161 and 166, an audible alarm indicating a frequency over 63 cycles or under 57 cycles is provided by alarm 180 which is driven by transistor 181 which receives its input signal from resistor 183 connected to pin 5 of counter 48 or from resistor 185 connected to pin 3 of counter 48. Transistor 181 is prevented from operating when counter 48 is counting by the base clamp provided by transistor 175 which is ON during the counting phase of operation.

The embodiment shown in FIG. 2 with the jumpers positioned at J₁ and J₃ provides 1 Hz resolution utilizing a 7200-Hz clock. If the jumpers are moved to positions J₂ and J₃ and resistors 131, 130, and capacitors 126 and 127 are changed to operate clock 24 at 6000 Hz, the nominal frequency of the input signal can be adjusted to 50 Hz with each step above and below 50 Hz being equal to a 1-Hz increment.

A further alteration to the circuit in FIG. 2 can be operated with 2 Hz resolution rather than 1 Hz resolution as shown in FIG. 2 by changing the clock frequency to 3600 Hz and placing the jumpers at J₄ and J₅.

Figure 3:
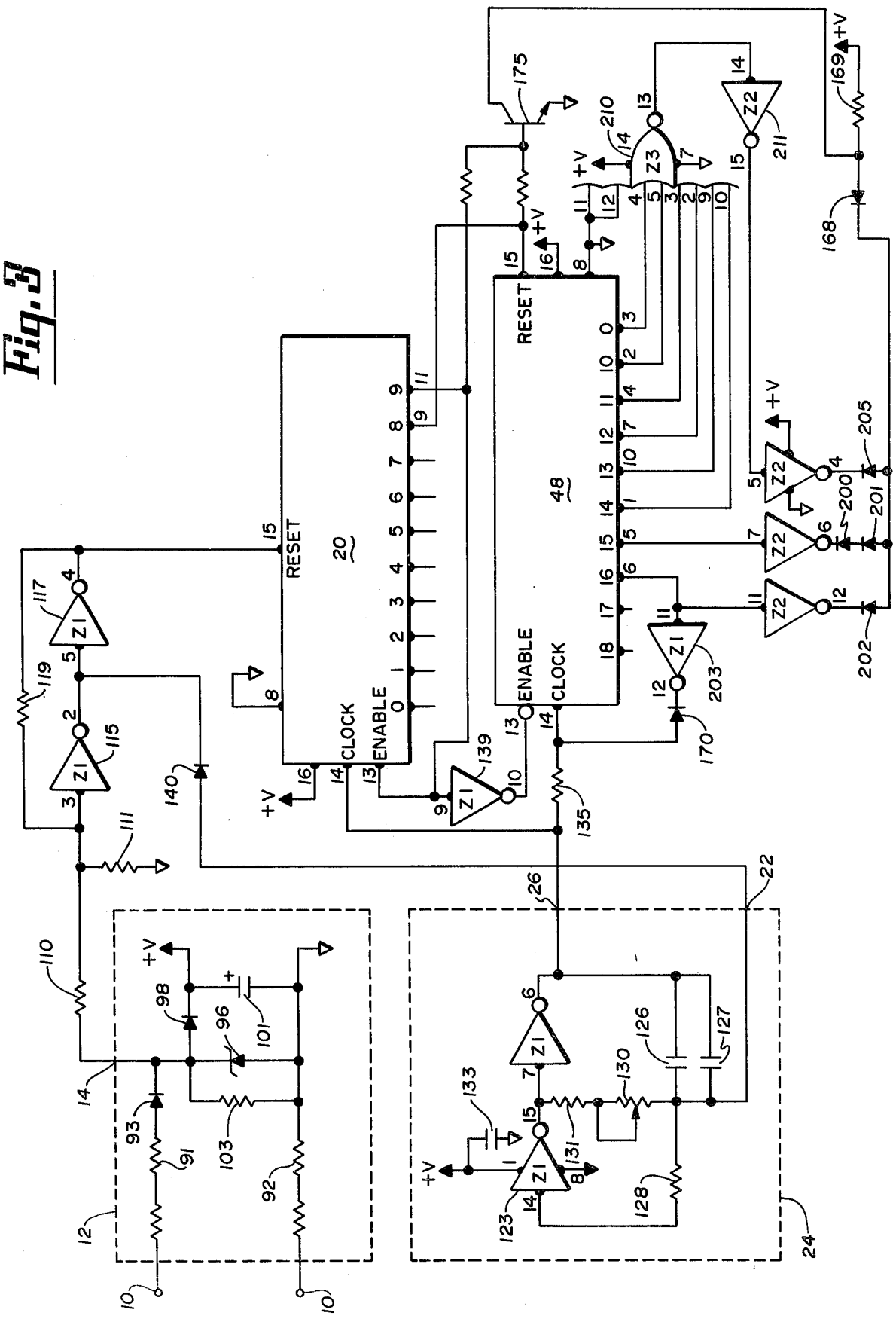
FIG. 3 is a schematic diagram of a simplified low resolution frequency meter according to the present invention.

FIG. 3 shows a simplified form of the preferred embodiment of the frequency meter shown in FIG. 2. The clock 24 is identical to clock 24 of FIG. 2 as is shaping circuit 12. Clock 24 is operated in the embodiment shown in FIG. 3 at 1800 Hz by appropriately selecting the values of capacitors 126 and 127 and resistors 131 and 130. The circuit in FIG. 3 also utilizes the same circuit for applying the reset pulse to counter 20 as the circuit in FIG. 2.

In the circuit shown in FIG. 3, only a single counter unit is used for counter 20 and receives its pulse input from clock 24 in the same manner as does the circuit in FIG. 2. After nine pulses have been counted by counter 20, the application of a positive signal to enable input at terminal 13 disables that counter from being advanced by further clock pulses received and enables counter 48 to count and respond to further pulse inputs. Counter 48 is reset by counter 20 when the eighth count is reached. At the time counter 48 is reset, transistor 175 clamps the drive voltage for the display diodes until counter 20 is reset at the conclusion of the measurement half cycle.

In the circuit shown in FIG. 3, the number of pulses indicative of one-half cycle of the nominal frequency is 15. If counter 48 reaches a count of 15 during its measurement time interval, it illuminates light emitting diodes 200 and 201. If 16 pulses are received, light emitting diode 202 is illuminated and the signal is inverted by amplifier 203 and connected to diode 170 to prevent counter 48 from being further advanced prior to the end of the measurement half cycle of input signal.

If less than 15 counts are received by counters 20 and 48 during the measurement cycle, the logic 1 will remain on one of pins 3, 2, 4, 7, 10, or 1 which respectively represent counts of nine pulses or less, 10, 11, 12, 13, or 14 pulses. The counter stages for those signals are connected to the inputs of a NOR gate 210 which has its output connected to an inverting buffer amplifier 211 to provide a positive voltage to the inverting buffer amplifier driving signal, driving light emitting diode 205. Thus, light emitting diodes 200 and 201 are actuated when the input frequency is between 58 and 62 Hz, light emitting diode 205 is actuated when the frequency is above 62 Hz, and light emitting diode 202 is actuated when the frequency is under 58 Hz.

Although the present invention has been described with respect to a preferred embodiment and several alterations thereof, it is not to be so limited as changes might be made therein which fall within the scope of the invention as defined in the appended claims.

What I claim is:

1. A frequency meter for measuring the deviation of an alternating current signal from a nominal frequency comprising:
   a clock generator for producing a train of pulses having a period at least 100 times shorter than those of the nominal frequency;
   means for generating a first logic signal when said alternating current signal has a first polarity value and a second logic signal when said signal has a second polarity;
   counter means connected to receive pulse inputs from said clock generator and also connected to receive signals from said means for generating said first and second logical signals, said counter means operative to count said pulses from said clock generator only when said second logic signal is applied thereto; and display means connected to receive an indication from that stage of said counter means which will be reached when the period of said alternating current signal has its nominal value, said display means operative to produce a tangible indication when the frequency of said input signal is equal to the nominal frequency.

2. Apparatus as claimed in claim 1 wherein further display means is connected to the next higher stage of said counter means, said further display means being operative to produce a tangible indication when the frequency of the alternating current signal is lower than the nominal frequency by a predetermined amount.

3. Apparatus as claimed in claim 2 wherein the relationship between the period of said train of clock pulses to said nominal frequency is selected such that a 1-Hz frequency variation of said alternating current frequency signal results in a tangible indication appearing on said further indicator.

4. Apparatus as claimed in claim 1 wherein further display means is connected to the next lower stage of said counter means, said further display means being operative to produce a tangible indication when the frequency of the alternating current signal is higher than the nominal frequency by a predetermined amount.

5. Apparatus as claimed in claim 4 wherein the relationship between the period of said train of clock pulses to said nominal frequency is selected such that a 1-Hz frequency variation of said alternating current frequency signal results in a tangible indication appearing on said further indicator.

6. Apparatus as claimed in claim 1 wherein further display means is connected to the next higher stage of said counter means, said further display means being operative to produce a tangible indication when the frequency of the alternating current signal is lower than the nominal frequency by a predetermined amount; and 7. Apparatus as claimed in claim 6 wherein control means, connected to receive outputs from the counter stages of said counter means connected to said further and said additional display means, is connected to operate a switching means when said alternating current frequency signal differs from the nominal frequency by a predetermined amount.

* * * * *

UNITED STATES PATENT AND TRADEMARK OFFICE
CERTIFICATE OF CORRECTION

PATENT NO. : 4,137,496
DATED : January 30, 1979
INVENTOR(S) : LeRoy R. Lind

It is certified that error appears in the above—identified patent and that said Letters Patent are hereby corrected as shown below:

Column 3, line 11, after "frequencies", insert
--of--.

Column 5, line 9, delete "to", and insert
--of-- therefor.

Signed and Sealed this

Twenty-fourth Day of April 1979

[SEAL]

Attest:

RUTH C. MASON
Attesting Officer

DONALD W. BANNER
Commissioner of Patents and Trademarks